United States Patent
Shortt et al.

(10) Patent No.: US 7,519,938 B1
(45) Date of Patent: Apr. 14, 2009

(54) STRATEGIES FOR GENERATING AN IMPLEMENTATION OF AN ELECTRONIC DESIGN

(75) Inventors: Robert E. Shortt, Sunnyvale, CA (US); David A. Knol, San Jose, CA (US); Salil Ravindra Raje, Saratoga, CA (US)

(73) Assignee: Xilinx, Inc., San Jose, CA (US)

( * ) Notice: Subject to any disclaimer, the term of this patent is extended or adjusted under 35 U.S.C. 154(b) by 287 days.

(21) Appl. No.: 11/543,388

(22) Filed: Oct. 5, 2006

(51) Int. Cl.
*G06F 17/50* (2006.01)

(52) U.S. Cl. .......................... 716/18; 716/2

(58) Field of Classification Search .............. 716/2, 716/16–18
See application file for complete search history.

(56) References Cited

U.S. PATENT DOCUMENTS

| 6,711,730 | B2 * | 3/2004 | Frank et al. | 716/18 |
| 7,080,345 | B1 * | 7/2006 | Iotov | 716/17 |
| 7,165,231 | B2 * | 1/2007 | Buckley, Jr. | 716/5 |
| 2004/0250231 | A1 * | 12/2004 | Killian et al. | 716/18 |

* cited by examiner

*Primary Examiner*—Jack Chiang
*Assistant Examiner*—Binh C Tat
(74) *Attorney, Agent, or Firm*—LeRoy D. Maunu; Lois D. Cartier (57) ABSTRACT

A method is provided for generating an implementation of an electronic design. Information describing a set of strategies is specified. Each strategy of the set includes one or more options for directing the generation of an implementation of the electronic design, with each option being a set of one or more input parameter values to an implementation tool. The set of strategies is displayed and a subset of the set of strategies is selected in response to user input. For each strategy of the subset, a respective implementation of the electronic design is generated from a specification of the electronic design in a hardware description language. The option or options of each strategy are input to one or more implementation tools to direct the generation of the respective implementation for the strategy. For each strategy of the subset, quality metrics are displayed for the respective implementation of the electronic design.

18 Claims, 6 Drawing Sheets

STRATEGIES FOR GENERATING AN IMPLEMENTATION OF AN ELECTRONIC DESIGN

FIELD OF THE INVENTION

The present invention generally relates to generating an implementation of an electronic design from a specification of the electronic design in a hardware description language.

BACKGROUND

An electronic design may be implemented by creating a specification of the functionality of the electronic design in a hardware description language (HDL) and translating the HDL specification of the electronic design into an implementation of the electronic design. Translation software may generate an implementation of the electronic design from the HDL specification of the electronic design.

The translation software may have options for directing the generation of an implementation of an electronic design. For example, translation software may have an option that specifies the generation of an implementation in a minimal amount of area for the circuitry of the implementation, and the translation software may have another option that specifies the generation of an implementation that has a minimal propagation delay along the signal paths of the circuitry of the implementation. An implementation generated with options to reduce circuit area may be quite different from an implementation of the same electronic design that is generated with options to reduce circuit propagation delay. Thus, translation software with many options may generate many different implementations of an electronic design depending on the options that are specified.

The circuit area and the circuit propagation delay are two quality metrics that may be importation for an implementation of a particular electronic design. The generation of an implementation of an electronic design may involve exploration of the options to achieve certain quality metrics that may include circuit area and circuit propagation delay. The exploration of the options may be an ad hoc process that generates a series of implementations until goals are achieved for the quality metrics, with the options for each successive implementation modified to address the shortcomings of the quality metrics for the preceding implementation. Tracking the options and the effects of the options on the resulting implementations may be difficult and time-consuming. For example, a designer may unintentionally select exactly the same options as were selected for a previous implementation of the electronic design.

The present invention may address one or more of the above issues.

SUMMARY OF THE INVENTION

Various embodiments of the invention provide a method for generating an implementation of an electronic design. Information describing a set of strategies is specified in a memory coupled to a processor. Each strategy of the set includes one or more options for directing the generation of an implementation of the electronic design, with each option being a set of one or more input parameter values to an implementation tool. The set of strategies is displayed and a subset of the set of strategies is selected in response to user input. For each strategy of the subset, a respective implementation of the electronic design is generated from a specification of the electronic design in a hardware description language. The option or options of each strategy are input to one or more implementation tools to direct the generation of the respective implementation for the strategy. For each strategy of the subset, quality metrics are displayed for the respective implementation of the electronic design.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings, in which.

DETAILED DESCRIPTION

Figure 1:
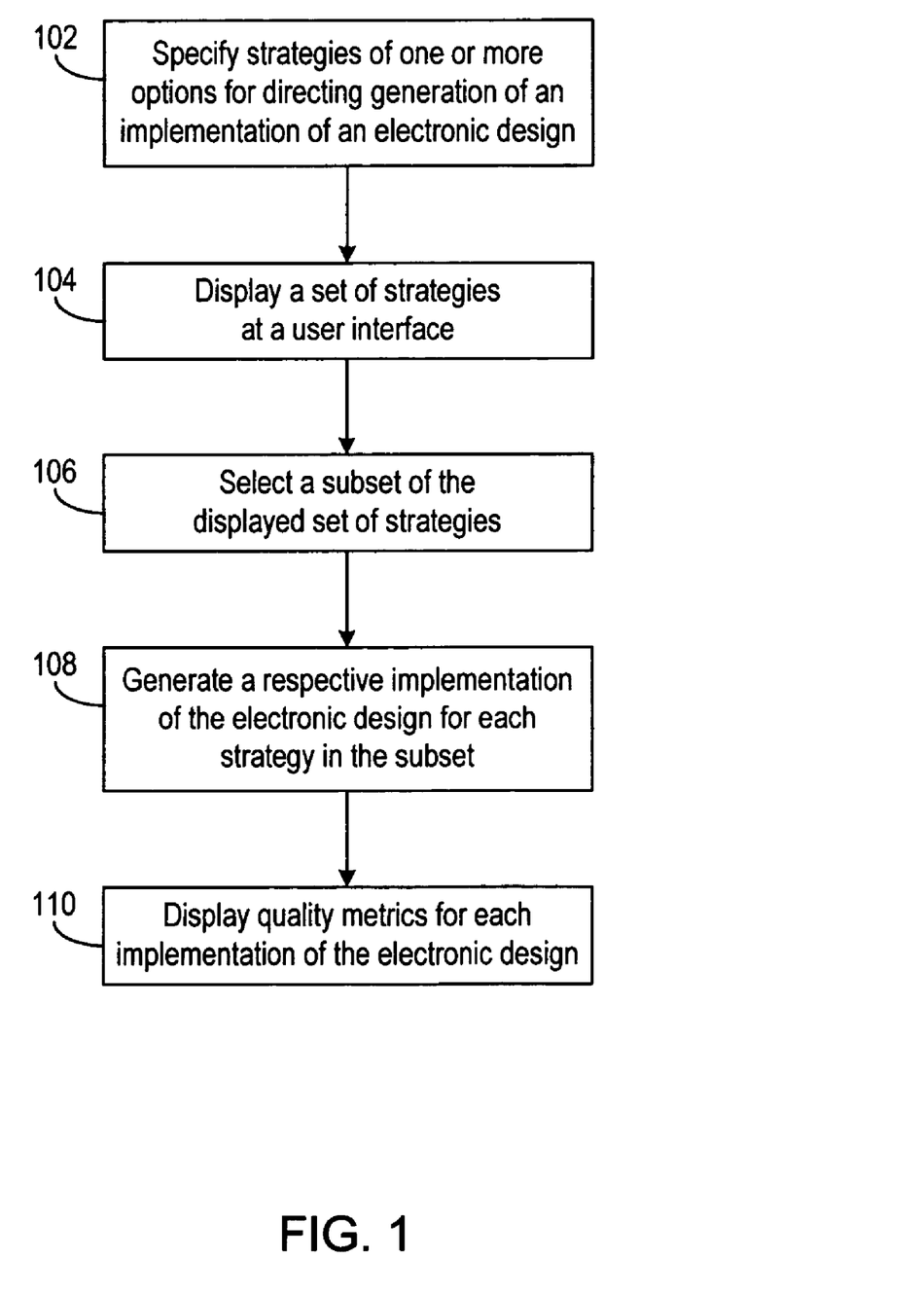
FIG. 1 is a flow diagram of a process for generating an implementation of an electronic design in accordance with various embodiments of the invention.

FIG. 1 is a flow diagram of a process for generating an implementation of an electronic design in accordance with various embodiments of the invention. Various strategies may be selected for generating corresponding implementations of a particular electronic design, and a user may assess the effectiveness of the strategies and the quality of the corresponding implementations based on displayed quality metrics for the generated implementations. The process may track and organize the selected strategies and corresponding implementations to permit efficient exploration of the design space of possible strategies.

At step 102, strategies are specified for directing the generation of an implementation of an electronic design. Tools, such as synthesis tools, may have options for directing the generation of an implementation of an electronic design. For example, a synthesis tool may have a command line option that specifies the amount of computational "effort" that should be expended in optimizing the implementation of the electronic design. Each strategy may specify a value of the computational effort for the synthesis tool along additional options for the synthesis tool and options for any other tools used to generate the implementation of the electronic design.

A set of default strategies are specified by a manufacturer and a user may create additional strategies by specifying the values of the options for each additional strategy or by modifying the options of an existing strategy, such as one of the default strategies. A user may create and evaluate various strategies and may supply the strategies that are found to be effective to other users.

The strategies are displayed on a user interface at step 104, and a subset of the displayed strategies may be selected at step 106. At step 108, a respective implementation of the electronic design is generated using the options for each strategy in the selected subset. At step 110, quality metrics are displayed for each implementation generated in step 108. Example quality metrics include an amount of computation time needed to generate each implementation and an amount of resources consumed by each implementation.

Figure 2:
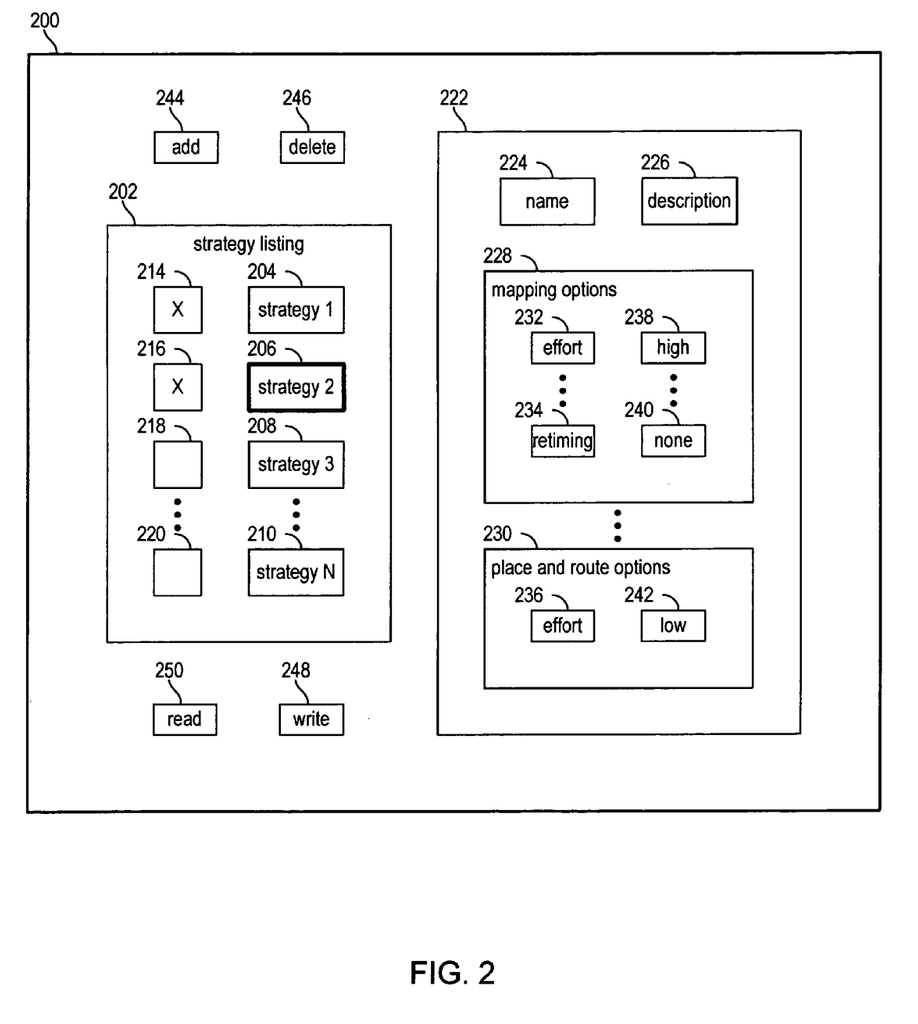
FIG. 2 is a block diagram of a user interface for strategies of generating an implementation of an example electronic design in accordance with various embodiments of the invention.

FIG. 2 is a block diagram of a user interface 200 for strategies of generating an implementation of an example electronic design in accordance with various embodiments of the invention. The user interface 200 may be used to create and modify various strategies for generating corresponding implementations of an electronic design.

A listing 202 may list the strategies that are currently specified. The strategies in listing 202 may include the strategies having identifiers 204, 206, 208, and 210 and respective selection boxes 214, 216, 218, and 220. Selection boxes 214 and 216 are shown marked to specify the selection of the strategies with identifiers 204 and 206. The marking of selection box 214 to select the strategy with identifier 204 may cause the strategy to be used for generating of an implementation of the electronic design, and the marking of selection box 216 to select the strategy with identifier 206 may cause the strategy to be used for generating another implementation of the electronic design.

In FIG. 2, the strategy identifier 206 is shown highlighted with a thick outline. A user may highlight any one of strategy identifiers 204, 206, 208, and 210, and for the highlighted identifier 206, strategy specification window 222 includes a specification of the corresponding strategy. In window 222, the name 224 displays a name of the strategy for the highlighted identifier 206 and the description 226 displays a description of the strategy for the highlighted identifier 206. In one embodiment, the name 224 may match the highlighted identifier 206.

A strategy may include various options for directing the generation of an implementation of an electronic design by various software tools. In one embodiment, the software tools include a mapping tool and a place and route tool. The mapping tool may map the components of the electronic design to the available types of primitives for implementing the electronic design, and the place and route tool may assign each primitive of the mapped components to a particular instance of the primitive. Each of the software tools may include a respective grouping 228 and 230 of the options for the strategy of the highlighted identifier 206. For example, a mapping tool may have a grouping 228 that includes options 232 and 234 for directing the mapping of the electronic design, and a place and route tool may have a grouping 230 that includes option 236 for directing the place and route of the electronic design.

Each of options 232, 234, and 236 of the strategy of the highlighted identifier 206 may have a respective value 238, 240, and 242 specified for the strategy. It will be appreciated that a software tool may have an option that is either enabled or disabled by providing or omitting the name of the option and that such an option might not have a corresponding value. For example, option 234 may be a register retiming option that is either provided as shown or omitted, and when named option 234 is provided as shown, value 240 may be either absent or present with a null value.

The strategy of the highlighted identifier 206 may be modified by changing the name 224 and description 226, or by deleting any of options 232, 234, and 230 and by adding a new option or new options and corresponding values to groups 228 and 230 of strategy specification window 222.

An add command 244 of the user interface 200 may be used to add a new strategy to strategy listing 202. In one embodiment, the new strategy is added to strategy listing 202 with a default strategy identifier and a new selection box that is unmarked. The new strategy identifier may be highlighted to prompt a user to specify the strategy in window 222, including specifying a name 224 that is used for the new strategy identifier in listing 202. The groupings 228 and 230 may be initialized for the new strategy to include all of the available options 232, 234, and 236 for the software tools and these options may be given default values 238, 240, and 242. In another embodiment, strategy identifier 206 may be highlighted before creating a new strategy using the add command 244, and a new strategy identifier may be created and highlighted in listing 202 with added options 232, 234, and 236 having values 238, 240, and 242 that match the previously existing strategy of the strategy identifier 206.

The strategy of the highlighted identifier 206 may be deleted using the delete command 246, causing the strategy identifier 206 and the selection box 216 to be removed from listing 202. In one embodiment, another one of identifiers 204, 208, and 210 may be highlighted upon deletion of the strategy for identifier 206, and the contents of strategy specification window 222 may switch to the specification of the strategy for the newly highlighted identifier. In another embodiment, the contents of strategy specification window 222 are cleared and no identifier in strategy listing 202 is highlighted.

Upon initiation of the write command 248, a file may be created that saves the contents of the strategy listing 202 and the contents of the strategy specification window 222 corresponding to each listed strategy. The same or another user may initiate the read command 250 to read the file. At startup, the user interface 200 may be initialized to read a manufacturer-specified set of default strategies from a file, including initialing the strategy listing 202 with unmarked check boxes 214, 216, 218, and 220 and with strategy identifiers 204, 206, 208, and 210 listed in an order of general effectiveness of the corresponding strategies. The effectiveness of the strategies may be determined by comparing the resulting implementations for each strategy for a representative set of electronic designs.

Figure 3:
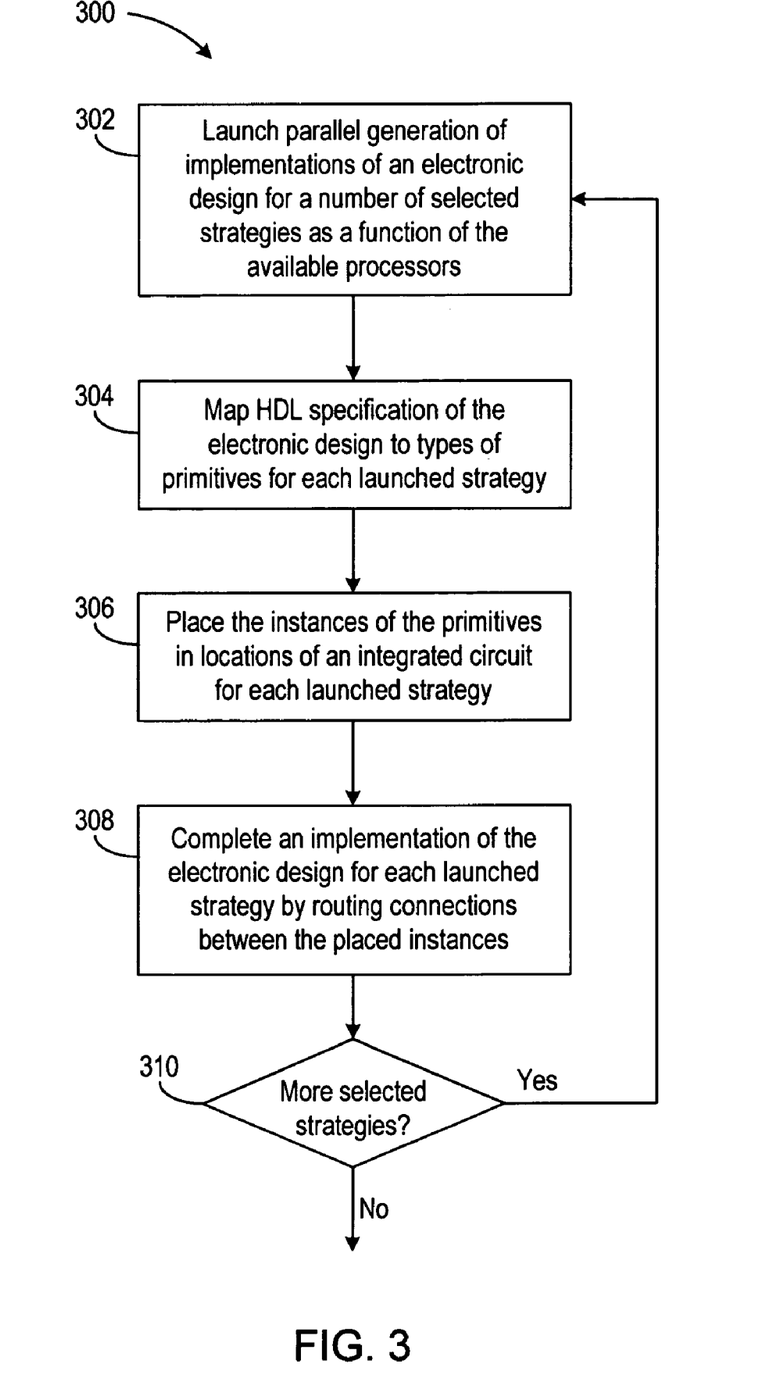
FIG. 3 is a flow diagram of an example process for parallel generation of implementations of an electronic design in accordance with various embodiments of the invention.

FIG. 3 is a flow diagram of an example process 300 for parallel generation of implementations of an electronic design in accordance with various embodiments of the invention. The time for generating multiple implementations may be reduced when some or all of the implementations of the electronic design are generated in parallel. A respective implementation of the electronic design may be generated for each selected strategy, and the selected strategies may correspond to the strategies with a marked selection box 214 and 216 of FIG. 2.

At step 302, the generation of an implementation for each selected strategy may be started by launching parallel synthesis of the electronic design for a limited number of the selected strategies. In one embodiment, a computer system for generating the implementations of the electronic design may have multiple processors that are utilized efficiently when the number of implementations being generated matches the number of processors. In another embodiment, because the processors may be underutilized during stalling for data input/output and other recurring operations, the number of implementations being generated is maintained at one more than the number of processors. In yet another embodiment, the number of implementations being generated is maintained at one less than the number of processors to reserve a portion of the processing power of the computer system for other tasks.

It will be appreciated that the number of implementations being generated in parallel may be maintained at a level that is a function of the number of available processors. For example, the synthesis of another implementation for a selected strategy may be automatically launched at step 302 when the number of running processes on the computer system drops below the number of processors of the computer system, or when a threshold is exceeded for the average idle time of the computer system. In one embodiment, the procedure for launching the generation of implementations and the various thresholds may be picked by a user from a suggested set of possible configurations.

For each strategy, the synthesis of step 302 may translate a description of the electronic design in a hardware description language into another description based on generic primitive components. The launched synthesis for each strategy may be directed to perform the synthesis in a manner controlled by certain of the options for the strategy. Because each strategy may include different synthesis options, the synthesis results may be different for each strategy.

At step 304, the generation of an implementation continues for the selected strategies launched at step 302. For example, the mapping of step 304 may map from the generic technology-independent components of synthesis to the specific types of primitives that are available in a particular implementation technology, such as a programmable logic device. The mapping for each strategy may be directed to perform the mapping in a manner controlled by certain of the options for the strategy.

At step 306, the primitive instances are placed in the available locations of an implementation technology, such as an integrated circuit. The placement for each launched strategy may be directed by options for the strategy. At step 308, connections are routed between the placed primitive instances to complete an implementation of the electronic design. The routing for each launched strategy may be directed by options for the strategy.

Upon completion of an implementation of an electronic design as directed by the options of a strategy, decision 310 checks whether another implementation needs to be generated. When an implementation needs to be generated for another selected strategy, process 300 returns to step 302 to launch the generation of an additional implementation.

Figure 4:
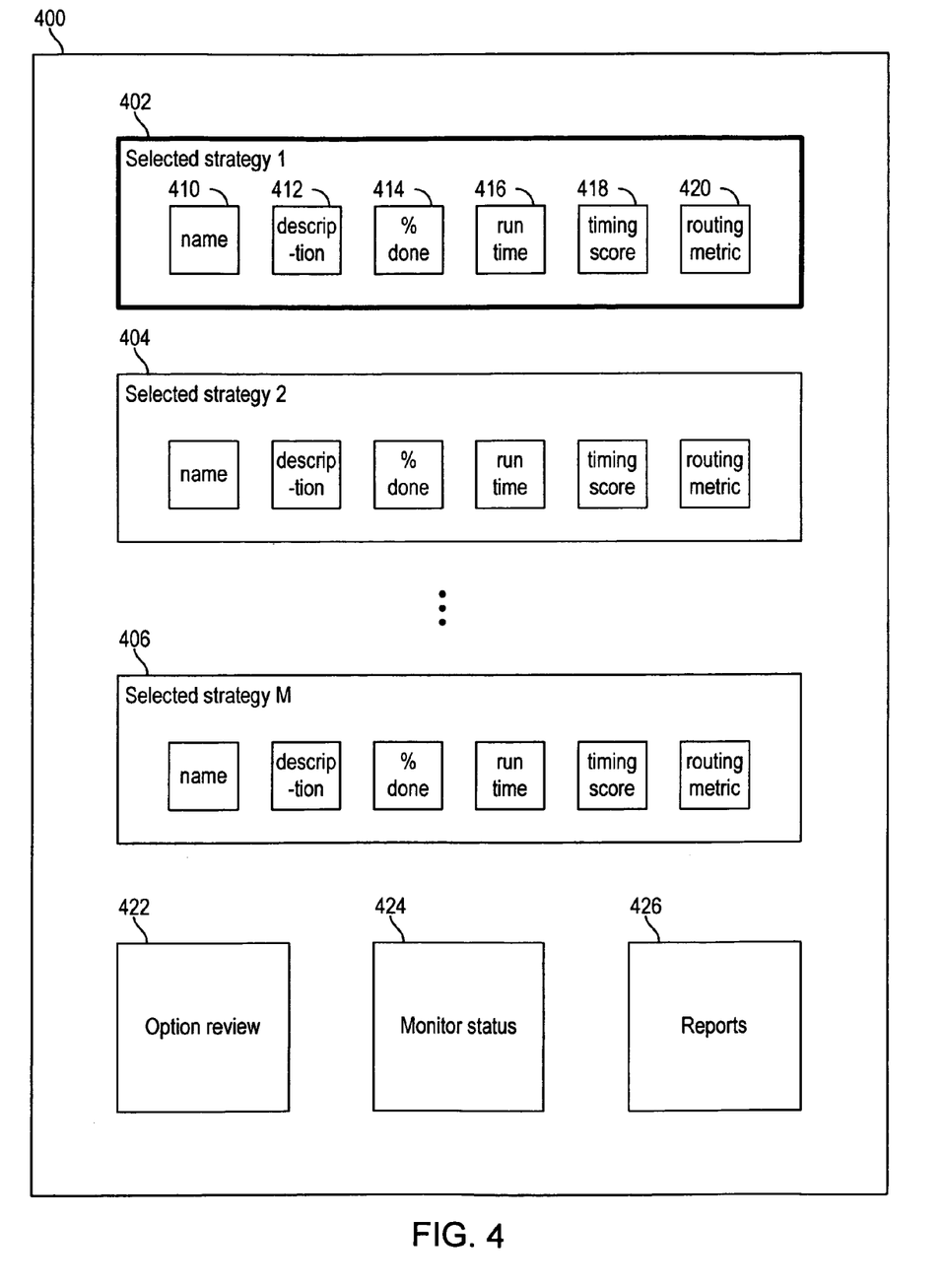
FIG. 4 is a block diagram of a user interface for displaying properties for selected strategies of generating implementations of an electronic design in accordance with one or more embodiments of the invention.

FIG. 4 is a block diagram of a user interface 400 for displaying properties for selected strategies of generating implementations of an electronic design in accordance with one or more embodiments of the invention. The properties may include various quality metrics for evaluating and comparing the generated implementations of the electronic design.

The user interface 400 may display the property windows 402, 404, and 406 for the selected strategies, which may correspond to the strategies with marked selection boxes 214 and 216 of FIG. 2. The properties for each selected strategy may include a name 410 and a description 412 that may correspond to the name 224 and description 226 of FIG. 2.

For each strategy, property 414 may estimate the percentage completion of the generation of the corresponding implementation of the electronic design. For each strategy, property 416 may provide the computation run time of the generation of the corresponding implementation of the electronic design. After an implementation is generated as directed by a strategy, the percentage done property 414 may be 100 percent and the run time property 416 may provide a quality metric of the computation time needed to generate the implementation of the electronic design for the strategy.

For a group of strategies that generate similar implementations as measured by certain quality metric properties 418 and 420, the strategy in the group having the minimum run time property 416 may be identified as an effective strategy within the group of strategies. Such an effective strategy as measured for a particular electronic design may be a generally effective strategy for many electronic designs.

A quality metric property 418 may provide a timing score for the implementation of the electronic design for a selected strategy. The timing score may calculate an operating frequency for the implementation and acceptable implementations may have a calculated operating frequency that exceeds a target operating frequency for the electronic design. Another quality metric property 420 may provide a routing score for the implementation of the electronic design for a selected strategy. For example, the quality metric property 420 may indicate the number of networks of the electronic design that could not be automatically routed during the generation of the implementation of the electronic design. Because a manual process may be needed to complete the routing of an implementation that is not fully routed automatically, the implementations with higher quality may be the implementations with a higher number of automatically routed networks. It will be appreciated that property windows 402, 404, and 406 may include additional quality metrics, such as the resource utilization of the corresponding implementation.

In one embodiment, the property windows 402, 404, and 406 for the selected strategies may be sorted by one or more of the name 410, description 412, or the properties 414, 416, 418, and 420. For example, the property windows 402, 404, and 406 may be sorted by the routing metric property 420 to position the better strategies and corresponding implementations toward the top of the user interface 400. The other properties of the property windows that are towards the top of the user interface 400 may be examined to pick a particular implementation for the electronic design and/or to pick one or more strategies that may be generally effective for implementing other electronic designs.

Property window 402 is shown highlighted in FIG. 4, as indicated by the thick outline. For the property window 402 that is highlighted, report windows 422, 424, and 426 may provide more information about the corresponding strategy and implementation of the electronic design. Option review window 422 may permit the options of the strategy to be examined in a manner similar to strategy specification window 222 of FIG. 2. The monitor status window 424 may track a real-time status output from the software tools during the generation of the implementation according to the corresponding strategy. The synthesis reports window 426 may provide detailed information that is summarized by certain properties in highlighted property window 402, such as timing score property 418 and routing metric property 420.

Figure 5:
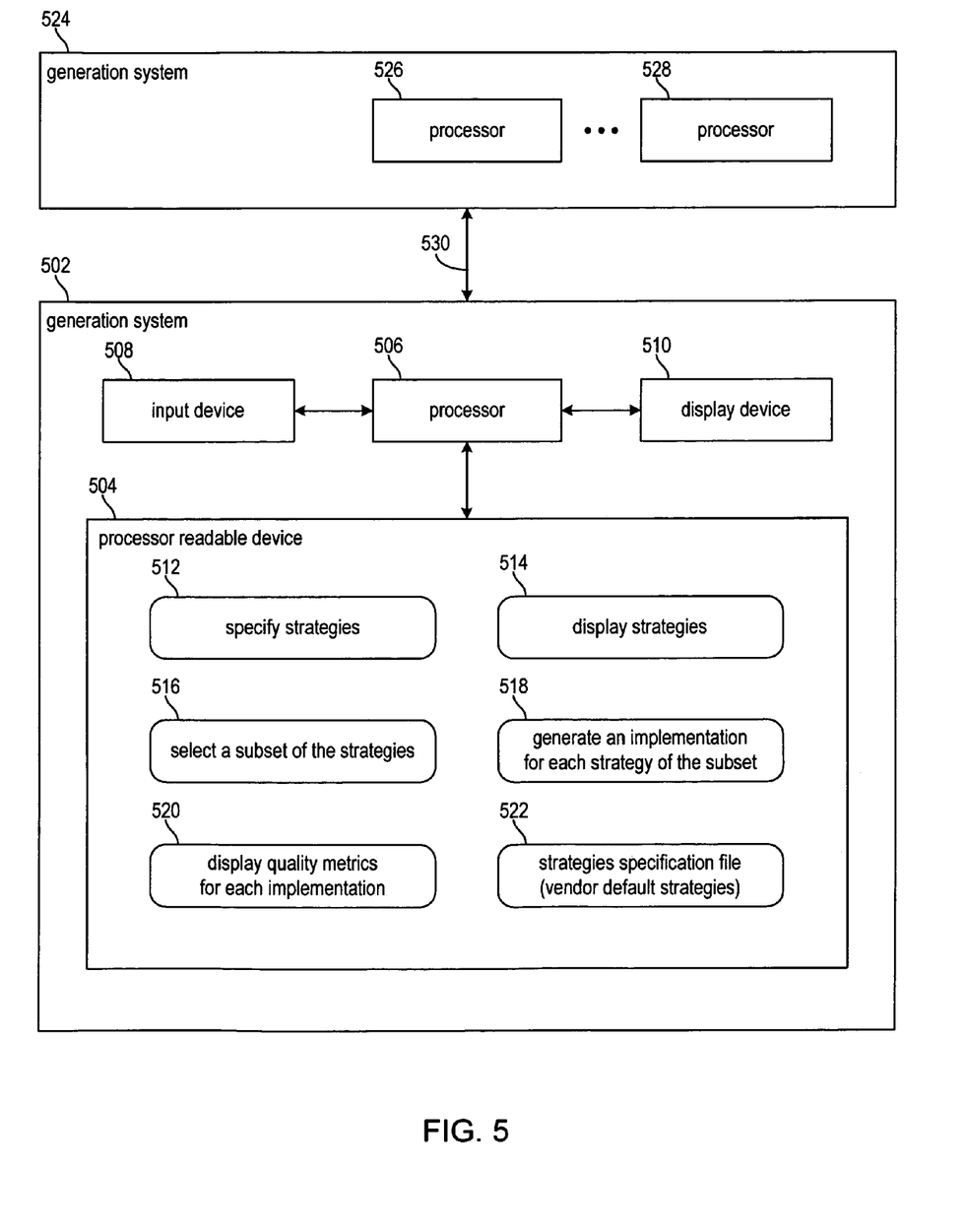
FIG. 5 is a block diagram of a system for generating an implementation of an electronic design in accordance with various embodiments of the invention.

FIG. 5 is a block diagram of a system for generating an implementation of an electronic design in accordance with various embodiments of the invention. A generation system 502 may include a processor readable device 504 configured with instructions for generating an implementation of an electronic design for each of a set of selected strategies. Each strategy may provide options for directing the software tools that generate an implementation of the electronic design, and certain of the strategies may be selected for generating a respective implementation of the electronic design as directed by the selected strategies.

The generation system 502 may include a processor 506 and a user interface that includes an input device 508 and a display device 510. Execution of the instructions of software modules 512, 514, 516, 518, and 520 may cause processor 506 to perform certain operations.

Execution of the instructions of software module 512 may cause processor 506 to specify a set of strategies for implementing an electronic design. The strategies may be specified in response to input from input device 508. Each strategy may include a set of options for controlling various software tools for generating an implementation of the electronic design as controlled by the options. Execution of the instructions of software module 514 may cause processor 506 to display the strategies on the display device 510.

Execution of the instructions of software module 516 may cause processor 506 to select a subset of the strategies specified using software module 512. Strategies may be selected from the strategies displayed on display device 510 in response to input from input device 508. The selected subset of strategies may also be displayed on display device 510.

Execution of the instructions of software module 518 may cause processor 506 to generate a respective implementation of the electronic design for each selected strategy. It will be appreciated that generation system 502 may include multiple processors as shown for generation system 524 having processors 526 and 528, and these processors may be used to concurrently generate multiple implementations for multiple selected strategies.

Execution of the instructions of software module 520 may cause processor 506 to display quality metrics on display device 510 for each implementation of the electronic design. The implementations and corresponding strategies may be sorted in response to selection of a quality metric for sorting using input device 508.

In addition to software modules 512, 514, 516, 518, and 520, processor readable device 504 may include a strategies specification file 522. In one embodiment, strategies specification file 522 is provided by a manufacturer of processor readable device 504 and specifies a set of strategies that are found to have general utility for many electronic designs. In another embodiment, the strategies specification file 522 includes strategies with demonstrated effectiveness for generating implementations of a particular electronic design. The effectiveness may be demonstrated on generation system 502 by the quality metrics displayed by software module 520 for the particular electronic design. The strategies specification file 522 may be shared with generation system 524 via network on line 530 for generating implementations of another electronic design. The sharing of strategies specification file 522 may include an electronic mail transfer of the strategies specification file 522 to the other generation system 524.

Those skilled in the art will appreciate that various alternative computing arrangements, including one or more processors and a memory arrangement configured with program code, would be suitable for hosting the processes and data structures of the different embodiments of the present invention. In addition, the processes may be provided via a variety of computer-readable media or delivery channels such as magnetic or optical disks or tapes, electronic storage devices, or as application services over a network.

Figure 6:
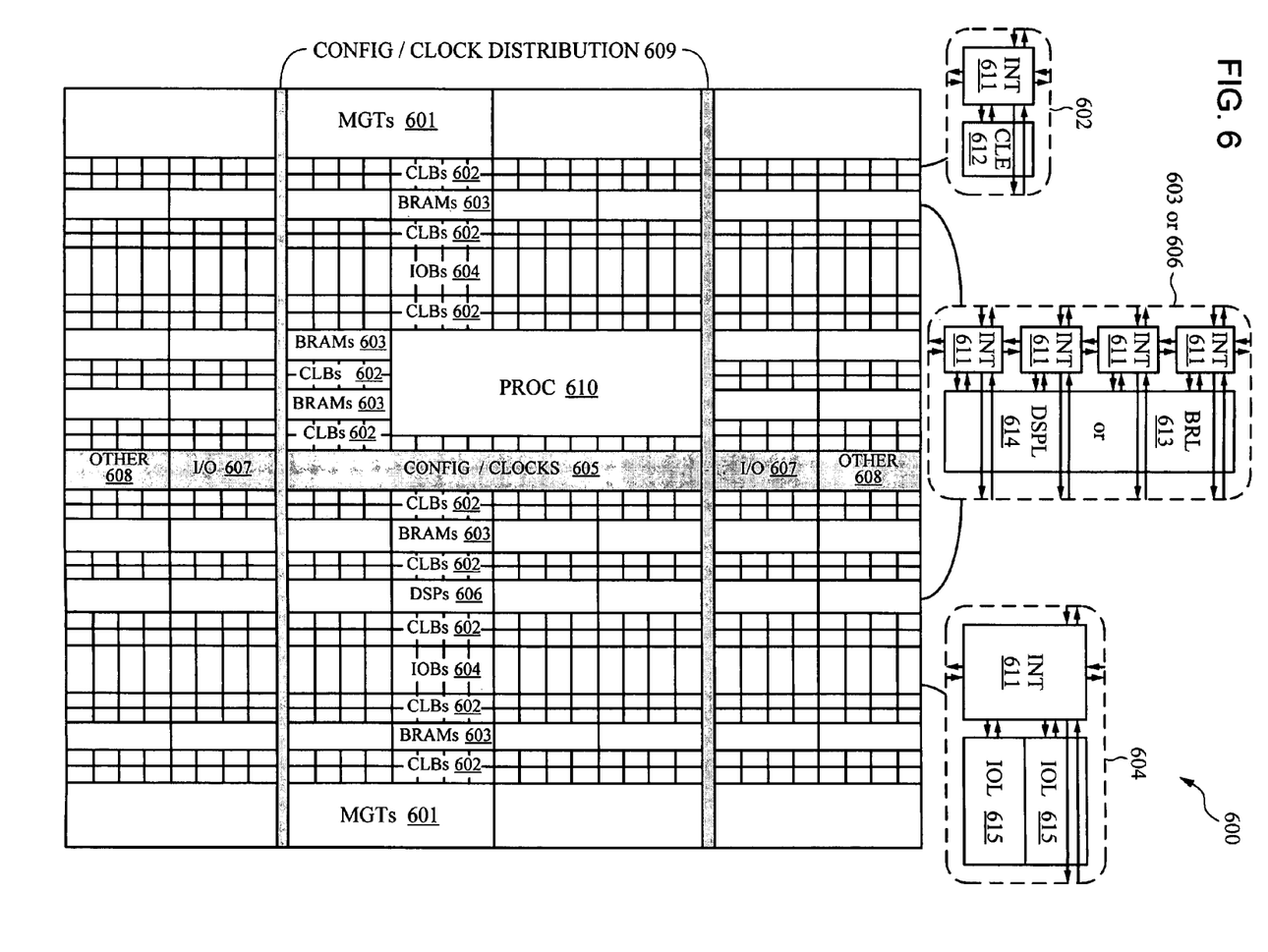
FIG. 6 is a block diagram of a programmable logic device for implementing an electronic design in accordance with various embodiments of the invention.

FIG. 6 is a block diagram of a programmable logic device (PLD) for implementing an electronic design in accordance with various embodiments of the invention. An electronic design may be synthesized and mapped to the primitives provided by the PLD and the connections may be routed between the placed primitive instances in the programmable logic device to complete an implementation of the electronic design. The synthesis, mapping, placing, and routing may be performed by software tools having command line control options. A respective implementation may be generated for certain selected strategies that define various sets of command line options for the software tools.

FIG. 6 illustrates a PLD 600 that includes a large number of different programmable tiles including multi-gigabit transceivers (MGTs 601), configurable logic blocks (CLBs 602), random access memory blocks (BRAMs 603), input/output blocks (IOBs 604), configuration and clocking logic (CONFIG/CLOCKS 605), digital signal processing blocks (DSPs 606), specialized input/output blocks (I/O 607) (e.g., configuration ports and clock ports), and other programmable logic 608 such as digital clock managers, analog-to-digital converters, system monitoring logic, and so forth. The programmable tiles may provide one or more primitives for implementing an electronic design. An implementation of the electronic device may be configuration data that is loaded into the PLD 600 via configuration and clocking logic 205 to configure the PLD to implement the electronic design. Some PLDs also include dedicated processor blocks (PROC 610).

In some PLDs, each programmable tile includes a programmable interconnect element (INT 611) having standardized connections to and from a corresponding interconnect element in each adjacent tile. Therefore, the programmable interconnect elements taken together implement the programmable interconnect structure for the illustrated PLD. The programmable interconnect element (INT 611) also includes the connections to and from the programmable logic element within the same tile, as shown by the examples included at the top of FIG. 6.

For example, a CLB 602 can include a configurable logic element (CLE 612) that can be programmed to implement user logic plus a single programmable interconnect element (INT 611). A BRAM 603 can include a BRAM logic element (BRL 613) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 606 can include a DSP logic element (DSPL 614) in addition to an appropriate number of programmable interconnect elements. An IOB 604 can include, for example, two instances of an input/output logic element (IOL 615) in addition to one instance of the programmable interconnect element (INT 611). As will be clear to those of skill in the art, the actual I/O pads connected, for example, to the I/O logic element 615 are manufactured using metal layered above the various illustrated logic blocks, and typically are not confined to the area of the input/output logic element 615.

In the pictured embodiment, a columnar area near the center of the die (shown shaded in FIG. 6) is used for configuration, clock, and other control logic. Horizontal areas 609 extending from this column are used to distribute the clocks and configuration signals across the breadth of the PLD.

Some PLDs utilizing the architecture illustrated in FIG. 6 include additional logic blocks that disrupt the regular columnar structure making up a large part of the PLD. The additional logic blocks can be programmable blocks and/or dedicated logic. For example, the processor block PROC 610 shown in FIG. 6 spans several columns of CLBs and BRAMs.

Note that FIG. 6 is intended to illustrate only an exemplary PLD architecture. The numbers of logic blocks in a column, the relative widths of the columns, the number and order of columns, the types of logic blocks included in the columns, the relative sizes of the logic blocks, and the interconnect/ logic implementations included at the top of FIG. 6 are purely exemplary. For example, in an actual PLD more than one adjacent column of CLBs is typically included wherever the CLBs appear, to facilitate the efficient implementation of user logic.

The present invention is thought to be applicable to a variety of systems for generating an implementation of an electronic design. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A processor-based method for generating an implementation of an electronic design, comprising:
    specifying in a memory coupled to a processor, information describing a set of strategies, each strategy of the set including at least one option for directing generation of an implementation of the electronic design, and each option being a set of one or more input parameter values to an implementation tool;
    displaying the set of strategies;
    selecting a subset of the set of strategies in response to user input;
    for each strategy of the subset, generating a respective implementation of the electronic design from a specification of the electronic design in a hardware description language, wherein the generating of the respective implementation of the electronic design for the strategy is directed by the at least one option of the strategy input to at least one implementation tool wherein the generating of the respective implementation of the electronic design for each strategy of the subset includes:
        mapping the specification of the electronic design to a plurality of instances of a plurality of primitives of an electronic device,
        placing the instances of the primitives in respective locations in the device, and
        routing connections between the respective locations in the device;
    wherein each option of each strategy of the set is an option for the mapping, the placing, and the routing; and
    for each strategy of the subset, displaying a plurality of quality metrics of the respective implementation of the electronic design.

2. The method of claim 1, wherein the specifying of the set of strategies includes specifying a strategy of the set that includes a plurality of options for directing generation of an implementation of the electronic design.

3. The method of claim 1, wherein the specifying of the set of strategies includes, for each option of each strategy of the set, providing a specification of the option that is either a name of the option or a combination of a name of the option and a value for the option.

4. The method of claim 1, wherein the specifying of the set of strategies includes displaying a plurality of options and, in response to user input, selecting at least one option from the plurality of options and adding the at least one option to a strategy of the set.

5. The method of claim 4, wherein the specifying of the set of strategies further includes deleting an option from the strategy of the set.

6. The method of claim 1, wherein the specifying of the set of strategies includes writing the set of strategies to a file.

7. The method of claim 6, further comprising transferring the file via a network, and, for each strategy of a selected subset of the set of strategies read from the file, generating a respective implementation of another electronic design, wherein the generating of the respective implementation of the another electronic design for the strategy is directed by the at least one option of the strategy.

8. The method of claim 1, wherein the specifying of the set of strategies includes reading from a file each strategy of a subset of the set of strategies.

9. The method of claim 8, wherein the file includes a set of a plurality of default strategies that is provided by a manufacturer of a system providing the method, the default strategies in the set prioritized in an order.

10. The method of claim 1, wherein the selecting of the subset of the set of strategies includes, in response to user input, adding a strategy from the set of strategies to the subset and deleting a strategy from the subset of the set of strategies.

11. The method of claim 1, wherein the generating of the respective implementation of the electronic design for each strategy of the subset includes generating for the strategy of the subset the respective implementation that is configuration data for a programmable logic device.

12. The method of claim 1, wherein the generating of the respective implementation of the electronic design for each strategy of the subset includes launching in parallel the generating of the respective implementation of the electronic design for a number of at least two of the strategies of the subset, the number of the strategies being a function of a number of processors of a computer performing the method.

13. The method of claim 1, wherein the displaying of the quality metrics of the respective implementation of the electronic design for each strategy of the subset includes displaying a table having a respective row for each strategy of the subset and a respective column for each of the quality metrics, each entry of the table at the respective row for a strategy and the respective column for a quality metric specifying a value of the quality metric for the strategy.

14. The method of claim 13, wherein the quality metrics include at least one of a processor run time of the generating of the respective implementation of the electronic design for the strategy, an estimated percentage completion of the generating of the respective implementation of the electronic design for the strategy, a timing result of the respective implementation of the electronic design for the strategy, and a routing metric of the respective implementation of the electronic design for the strategy.

15. The method of claim 13, wherein the displaying of the quality metrics of the respective implementation of the electronic design for each strategy of the subset further includes selecting the respective row in the table for a strategy in response to user input and displaying a report of the generating of the respective implementation of the electronic design for the strategy.

16. The method of claim 15, wherein the displaying of the report of the generating of the respective implementation of the electronic design for the strategy includes at least one of reviewing the at least one option of the strategy, monitoring a status of the generating of the respective implementation of the electronic design for the strategy, and displaying a report produced during the generating of the respective implementation of the electronic design for the strategy.

17. A system for generating an implementation of an electronic design, comprising:
    means for specifying information describing a set of strategies, each strategy of the set including at least one option for directing generation of an implementation of the electronic design, and each option being a set of one or more input parameter values to an implementation tool;

means for displaying the set of strategies;

means for selecting a subset of the set of strategies in response to user input;

for each strategy of the subset, means for generating a respective implementation of the electronic design from a specification of the electronic design in a hardware description language, wherein the generating of the respective implementation of the electronic design for the strategy is directed by the at least one option of the strategy input to at least one implementation tool wherein the means generating includes:
   means for mapping the specification of the electronic design to a plurality of instances of a plurality of primitives of an electronic device,
   means for placing the instances of the primitives in respective locations in the device, and
   means for routing connections between the respective locations in the device;

wherein each option of each strategy of the set is an option for the mapping, the placing, and the routing; and for each strategy of the subset, means for displaying a plurality of quality metrics of the respective implementation of the electronic design.

18. A program storage medium, comprising:

a processor-readable device configured with instructions for generating an implementation of an electronic design, wherein execution of the instructions by one or more processors causes the one or more processors to perform operations including, specifying in a memory information describing a set of strategies, each strategy of the set including at least one option for directing generation of an implementation of the electronic design, and each option being a set of one or more input parameter values to an implementation tool, displaying the set of strategies, selecting a subset of the set of strategies in response to user input, for each strategy of the subset, generating a respective implementation of the electronic design from a specification of the electronic design in a hardware description language, wherein the generating of the respective implementation of the electronic design for the strategy is directed by the at least one option of the strategy input to at least one implementation tool wherein the generating of the respective implementation of the electronic design for each strategy of the subset includes:
   mapping the specification of the electronic design to a plurality of instances of a plurality of primitives of an electronic device,
   placing the instances of the primitives in respective locations in the device, and
   routing connections between the respective locations in the device;

wherein each option of each strategy of the set is an option for the mapping, the placing, and the routing, and for each strategy of the subset, displaying a plurality of quality metrics of the respective implementation of the electronic design.

\* \* \* \* \*